(12) United States Patent
Fujita et al.

(10) Patent No.: US 12,364,063 B2
(45) Date of Patent: Jul. 15, 2025

(54) PHOTOELECTRIC CONVERSION DEVICE

(71) Applicant: S-Nanotech Co-Creation Co., Ltd., Matsue (JP)

(72) Inventors: Yasuhisa Fujita, Matsue (JP); Kuninori Kitahara, Matsue (JP); Jie Lin, Matsue (JP)

(73) Assignee: S-Nanotech Co-Creation Co., Ltd., Matsue (JP)

( * ) Notice: Subject to any disclaimer, the term of this patent is extended or adjusted under 35 U.S.C. 154(b) by 471 days.

(21) Appl. No.: 17/793,387

(22) PCT Filed: Feb. 5, 2021

(86) PCT No.: PCT/JP2021/004198
§ 371 (c)(1),
(2) Date: Jul. 16, 2022

(87) PCT Pub. No.: WO2021/145462
PCT Pub. Date: Jul. 22, 2021

(65) Prior Publication Data
US 2023/0052837 A1    Feb. 16, 2023

(30) Foreign Application Priority Data
Jan. 16, 2020 (JP) ................................. 2020-005113

(51) Int. Cl.
*H10H 20/81* (2025.01)
*H10F 77/123* (2025.01)
(Continued)

(52) U.S. Cl.
CPC ......... *H10H 20/818* (2025.01); *H10F 77/123* (2025.01); *H10F 77/162* (2025.01); *H10H 20/823* (2025.01)

(58) Field of Classification Search
CPC . H01L 33/18; H01L 31/0296; H01L 31/0384; H01L 33/28; H01L 31/02167;
(Continued)

(56) References Cited

U.S. PATENT DOCUMENTS

2008/0237628 A1* 10/2008 Satoh ..................... H01L 33/18
438/22
2010/0078072 A1* 4/2010 Nishida ................. H01L 31/073
136/261
(Continued)

FOREIGN PATENT DOCUMENTS

JP    2005-060145 A    3/2005
JP    2008-251876 A    10/2008
(Continued)

*Primary Examiner* — S M Sohel Imtiaz
(74) *Attorney, Agent, or Firm* — Hawaii Patent Services; Nathaniel K. Fedde; Kenton N. Fedde (57) ABSTRACT

Provided are a solar cell and a light emitting device with low leakage current and low cost, using ZnO fine particles. A p-type ZnO layer (p-type layer) made primarily of p-type ZnO fine particles is formed. P-side electrodes are formed at a plurality of regions on the p-type layer. A thin insulating layer is formed between an n-type layer and the p-type layer. In the insulating layer, openings are formed at regions A each not overlapping the p-side electrodes and being apart from them in a plan view. In the configuration, by thus making the p-side electrodes apart from the regions A, the length of a current path in the p-type layer can be made substantially larger than the layer thickness.

7 Claims, 6 Drawing Sheets

(51) Int. Cl.
*H10F 77/162* (2025.01)
*H10H 20/818* (2025.01)
*H10H 20/823* (2025.01)

(58) Field of Classification Search
CPC ....... H01L 31/022425; H01L 31/03529; H01L 31/073; H01L 31/125; H01L 33/14; H01L 33/38; H10H 20/818; H10H 20/823; H10H 20/831; H10H 20/816; H10F 77/123; H10F 77/162; H10F 10/162; H10F 55/18; H10F 77/148; H10F 77/211; H10F 77/311
See application file for complete search history.

(56) References Cited

U.S. PATENT DOCUMENTS

| | | | | |
|---|---|---|---|---|
| 2010/0264411 A1* | 10/2010 | Fujii | ............... | H01L 33/28 257/43 |
| 2011/0133159 A1* | 6/2011 | Jiang | ............... | H01L 33/145 438/38 |

FOREIGN PATENT DOCUMENTS

| | | | |
|---|---|---|---|
| JP | 2008244387 A | * | 10/2008 |
| JP | 2013-168406 A | | 8/2013 |
| JP | 2013-175507 A | | 9/2013 |
| JP | 2013-214663 A | | 10/2013 |
| JP | 2016-060678 A | | 4/2016 |
| WO | 2013/125719 A | | 8/2013 |

* cited by examiner

PHOTOELECTRIC CONVERSION DEVICE

BACKGROUND

Technical Field

The present invention relates to a photoelectric conversion device using zinc oxide (ZnO) as its material and converting light into electricity or electricity into light.

Background Art

There are known various types of solar cells that convert visible light into electrical energy, such as single-crystal silicon solar cells, silicon thin-film solar cells, dye-sensitized solar cells, and organic solar cells. These solar cells are required both to have high photoelectric conversion efficiency and to be capable of being produced at low cost.

Here, the capability of being produced at low cost means that a large-area solar cell can be produced at low cost. While high photoelectric conversion efficiency can be obtained in single-crystal silicon solar cells and quantum dot type solar cells, these types of solar cells are extremely difficult to satisfy the capability. Silicon thin-film solar cells, dye-sensitized solar cells, organic solar cells, and the like are advantageous in the respect of the capability, but it is theoretically difficult to obtain high photoelectric conversion efficiency with these types of solar cells. Thus, as a general tendency in the solar cells, there is a trade-off relationship between high energy conversion efficiency and the capability of being produced at low cost.

Zinc oxide (ZnO) is also known as a material of the solar cells described above. ZnO has advantages of inexpensiveness and of low toxicity to the human body. However, in respect of the fact that a p-n junction needs to be created for obtaining a solar cell, ZnO is a material whose conduction type is very difficult to control compared with silicon and the like, where, in general, n-type ZnO formation is easy but p-type ZnO formation is very difficult. In this respect, Patent Documents 1 and 2 describes that p-type ZnO fine particles can be inexpensively and easily synthesized by a gas evaporation method, and Patent Document 3 describes that, using a p-type layer formed of the fine particles, a p-n junction (p-n diode) can be created and a high-efficiency solar cell thereby can be obtained. ZnO is also known to show excitonic luminescence, which can be used to obtain a light emitting device. Patent Document 4 describes a high-efficiency light emitting device using a similar p-type layer formed of the p-type ZnO fine particles.

The above-described p-type layers can be obtained, for example, in the form of a sintered body, by applying a dispersion liquid of the above-described fine particles onto an n-type layer and performing subsequent firing at a temperature of about 300° C., as described in Patent Document 3. Accordingly, a solar cell or a light emitting device can be obtained at extremely low cost. Further, since the technology enables easy fabrication of such devices with a large area, a large-area solar cell, display, lighting device or the like can be obtained using the technology.

CITATION LIST

Patent Literature

Patent Document 1: Japanese Patent Application Laid-Open No. 2005-60145

Patent Document 2: Japanese Patent Application Laid-Open No. 2016-60678

Patent Document 3: Japanese Patent Application Laid-Open No. 2013-175507

Patent Document 4: Japanese Patent Application Laid-Open No. 2008-244387

SUMMARY OF INVENTION

Technical Problem

As described above, a basic element of a solar cell or light emitting device using ZnO is a p-n diode. To make the device function well, it is required that the current-voltage characteristics of the p-n diode is good, that is, only intrinsic current based on the forward and reverse characteristics of the p-n diode flows, and leakage current, which is another current component, never flows. In this respect, it sometimes occurs that the leakage current is high in a p-n diode using a p-type layer made of a sintered body of p-type ZnO fine particles in the above-described way.

The present invention has been made in view of the above-described problem, and accordingly is aimed at providing an invention for solving the problem.

Solution to Problem

To solve the problem, the present invention is configured as follows.

A photoelectric conversion device according to the present invention is a photoelectric conversion device having a configuration in which a first semiconductor layer of a first conduction type and a second semiconductor layer of a second conduction type opposite to the first conduction type, the semiconductor layers each including zinc oxide (ZnO), are in contact with each other in a vertical direction to form a p-n junction on a substrate, the photoelectric conversion device being characterized by: that one of the first and second semiconductor layers is formed by combining fine particles primarily consisting of ZnO fine particles of a conduction type corresponding to the one of the first and second semiconductor layers; and that an insulating layer having an opening formed in a region corresponding to a region where the p-n junction is to be formed is provided between the first and second semiconductor layers, and an electrode connected to the one of the first and second semiconductor layers is formed in a manner of not overlapping the opening in a plan view.

The photoelectric conversion device according to the present invention is characterized by that the electrode has a ring shape surrounding the periphery of the opening in a plan view.

A photoelectric conversion device according to the present invention is a photoelectric conversion device having a configuration in which a first semiconductor layer of a first conduction type and a second semiconductor layer of a second conduction type opposite to the first conduction type, the semiconductor layers each including zinc oxide (ZnO), are in contact with each other in a vertical direction to form a p-n junction on a substrate, the photoelectric conversion device being characterized by that one of the first and second semiconductor layers is formed by combining fine particles primarily consisting of ZnO fine particles of a conduction type corresponding to the one of the first and second semiconductor layers, the fine particles having an average particle size ranging from 50 to 500 nm, and the one of the first and second semiconductor layers is set to have a thickness in a range from 5 to 10 μm.

The photoelectric conversion device according to the present invention is characterized by that the one of the first and second semiconductor layers is formed such that n-type ZnO fine particles are incorporated in and combined with powders primarily consisting of p-type ZnO fine particles.

The photoelectric conversion device according to the present invention is characterized by that the second conduction type is p-type, and the photoelectric conversion device includes the first semiconductor layer of n-type, the second semiconductor layer and an electrode sequentially on the substrate.

The photoelectric conversion device according to the present invention is characterized by that it includes, between the one of the first and second semiconductor layers and the electrode, a carrier transport layer having the same conduction type as the one of the first and second semiconductor layers and formed by mixing ZnO fine particles of the same conduction type with insulating binder.

The photoelectric conversion device according to the present invention is characterized by that at least either of the first and second semiconductor layers emits light when voltage is applied to the first and second semiconductor layers to bias the p-n junction in the forward direction.

The photoelectric conversion device according to the present invention is characterized by that the substrate is made of metal, and light is extracted from the side opposite to the side where the substrate is present.

Advantageous Effects of Invention

Being configured as described above, the present invention enables reduction of leakage current in the photoelectric conversion device using a semiconductor layer in the form of a sintered body of ZnO fine particles.

DETAILED DESCRIPTION

In a photoelectric conversion device according to an embodiment of the present invention, p-type ZnO fine particles are used to form a p-type layer, similarly to in the devices described in Patent Documents 3 and 4. The ZnO fine particles are easily produced by, for example, a gas evaporation method described in Patent Documents 1 and 2.

The p-type ZnO fine particles used in the present invention are ZnO particles having an average particle size ranging from 50 nm to 500 nm. The average particle size of the ZnO fine particles is measured by a method described in JIS Z 8828. The reason of selecting such an average particle size range is that, when the average particle size of the ZnO particles is less than 50 nm, the crystal surface acts as a defect, and when the average particle size exceeds 500 nm, the particles are each formed to be a polycrystalline one with defects included within it, both of which cause performance degradation in either a solar cell or a light emitting device. Preferably, the average particle size of the ZnO fine particles is 100 to 500 nm.

The p-type ZnO fine particles used in the present invention are preferably nitrogen-doped ZnO fine particles, where the nitrogen concentration is from $10^{16}$ to $10^{20}$ cm$^{-3}$. The reason of selecting such a nitrogen concentration range is that, hole transport becomes insufficient when the nitrogen concentration is lower than $10^{16}$ cm$^{-3}$, and defects are created when the nitrogen concentration exceeds $10^{20}$ cm$^{-3}$, both of which degrade the light emission characteristic. The p-type ZnO fine particles having such characteristics can be produced by the production method described in Patent Document 1 or Patent Document 2.

Figure 1:
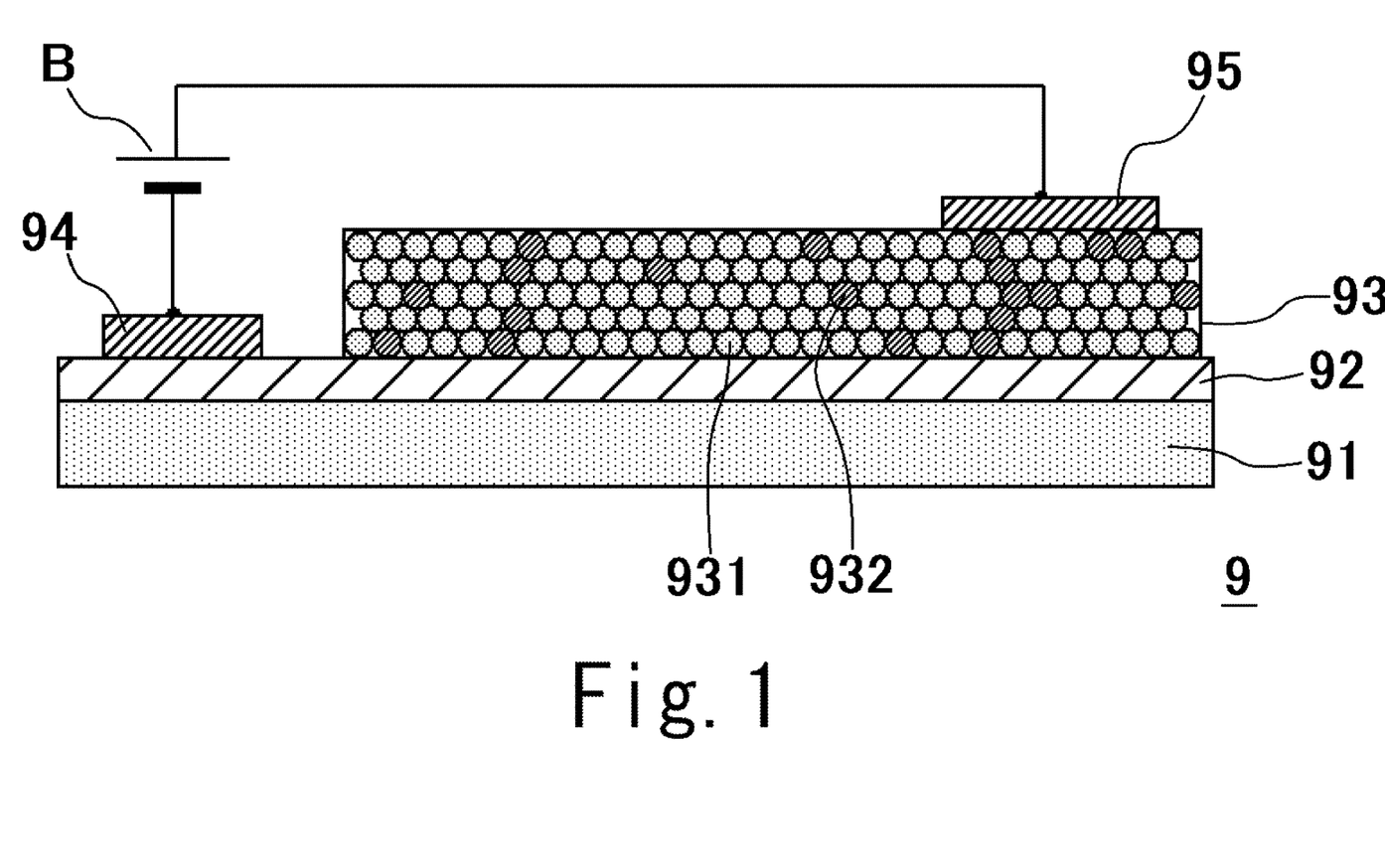
FIG. 1 is a cross-sectional diagram showing a light emitting device according to a comparative example or a first embodiment.

FIG. 1 is a cross-sectional diagram showing a structure of a light emitting device 9 in the prior art having such a p-type layer as just described above. There, an n-type layer (a first semiconductor layer) 92 and a p-type layer (a second semiconductor layer) 93 are sequentially formed on a transparent glass substrate 91. An n-side electrode 94 is formed on a region of the n-type layer 92, the region being exposed with the p-type layer 93 not being formed thereon, and a p-side electrode 95 is formed on a part of the surface of the p-type layer 93. When a forward voltage (voltage to set the p-side electrode 95 positive and the n-side electrode 94 negative) is applied through a power supply B, a forward current flows in the p-n junction, the n-type layer 92 and the p-type layer 93 accordingly emit light, and the emitted light is extracted toward the bottom side via the glass substrate 91. The light can be extracted also from the top side, while it is partly blocked by the p-side electrode 95 on the top side. Here, the p-type layer 93 is made of a sintered body of p-type ZnO fine particles 931 as described above.

Figure 2:
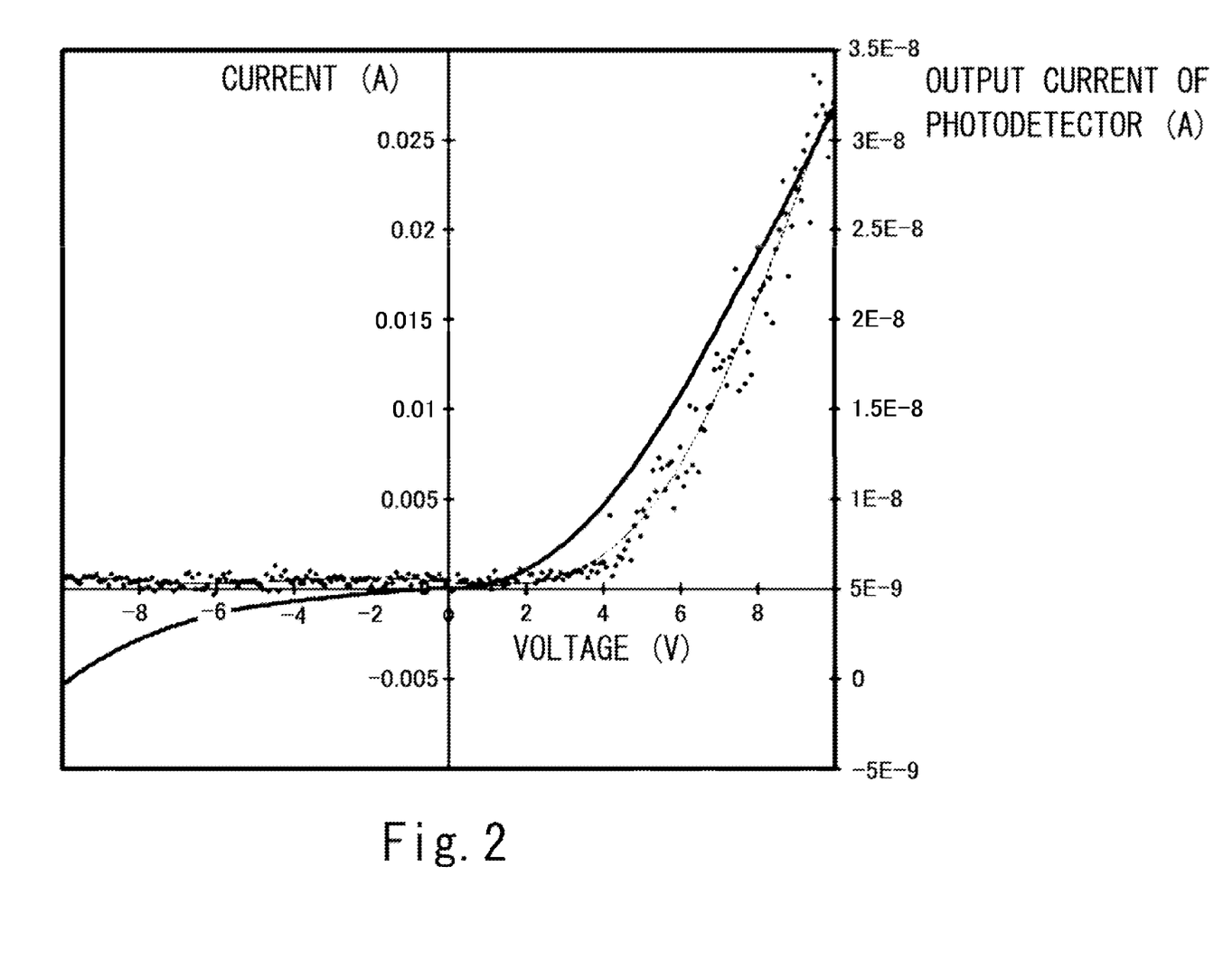
FIG. 2 shows an example of a current-voltage characteristic of a light emitting device in the prior art.

In the current-voltage characteristics of the light emitting device 9, when the polarity of the power supply B is made reverse to that of FIG. 1 and accordingly a reverse voltage (voltage to set the p-side electrode 95 negative and the n-side electrode 94 positive) is applied, the p-n diode composed of the n-type layer 92 and the p-type layer 93 becomes in a reverse bias state, and there accordingly flows only a negligible amount of current. However, there may occur a case the current increases to a degree that cannot be neglected. FIG. 2 shows an example of measuring such characteristics in the light emitting device 9 of FIG. 1, where a solid line represents a current-voltage characteristic, and plotted data represent voltage dependence of measured emission intensity (output current of a photodetector). There, concerning the emission intensity, owing to the presence of a background component, a level of $5 \times 10^{-9}$ substantially corresponds to zero emission intensity. In the reverse direction (negative voltage side), the emission intensity is zero, and the flowing current is the reverse current of the p-n junction. The reverse current theoretically is to be at a negligible level compared with the forward one (current in the positive voltage side), but the absolute values of the reverse current were measured to be at a level that cannot be neglected, owing to the presence of leakage current.

The inventors investigated the result to find its cause, and recognized that it is caused by incorporation of a minute amount of n-type ZnO fine particles 932, as depicted in FIG.

1, in the p-type layer 93, which essentially is to consist of only p-type ZnO fine particles 931. The incorporation is caused by that the n-type ZnO fine particles 932 also are formed at the same time when the p-type ZnO fine particles 931 are produced by the gas evaporation method as described above, and powders consisting of the two types of fine particles mixed therein are used for forming the p-type layer 93. As a result, between the n-type layer 92 and the p-side electrode 95, a current path via the n-type ZnO fine particles 932 is formed within the p-type layer 93, as shown in FIG. 1, and the current path serves as a leakage current path.

When the length of such a leakage current path is increased, the probability of interposing some of the p-type ZnO fine particles 931 along the path is increased, and thereby the leakage current path is cut off. Therefore, in reducing such leakage current, it is effective to set the length of the current path from the n-type layer 92 to the p-side electrode 95 within the p-type layer 93 to be large. Hereinafter, a description will be given of a light emitting device having a structure that enables such increasing of the leakage current path. The structure is effective in both a solar cell for converting light into an electric signal and a light emitting device for converting current into light (luminescence). That is, the structure is generally effective in any photoelectric conversion device provided with a p-n junction composed of semiconductor layers made of ZnO fine particles. Hereinafter, a light emitting device corresponding to an example of such a photoelectric conversion device will be described.

First Embodiment

In FIG. 1, the length of a leakage current path is almost equal to the thickness of the p-type layer 93. For this reason, in a light emitting device according to a first embodiment, the p-type layer (second semiconductor layer) 93 in FIG. 1 is set to have a large thickness in order to increase the length of a leakage current path as described above. For this purpose, it is effective to make the thickness of the p-type layer 93 sufficiently larger than the average particle size of the p-type ZnO fine particles 931 (50 to 500 nm). It is general that, with increasing the thickness of the a thin film layer, the resistance of the thin film layer in the thickness direction increases in proportion to the film thickness, but in the present case, because a current path via the n-type ZnO fine particles 932 can be cut off by the p-type ZnO fine particles 931 as described above, the resistance can be increased by a remarkably larger amount than that of increase due to the generally known simple thickness dependence of thin film resistance, and thereby the leakage current can be reduced. Here, when the average particle size of the p-type ZnO fine particles 931 and that of the n-type ZnO fine particles 932 are that described earlier, the thickness of the p-type layer 93 preferably is set at 5 μm or larger. However, as the forward resistance is also increased by the increase of the thickness, the thickness preferably is set at 10 μm or smaller. That is, in the case the n-type ZnO fine particles 932 are incorporated in a minute amount in the p-type ZnO fine particles 931, it is preferable to set the p-type layer 93 to have a thickness in a range from 5 to 10 μm when forming it.

Second Embodiment

Figure 3:
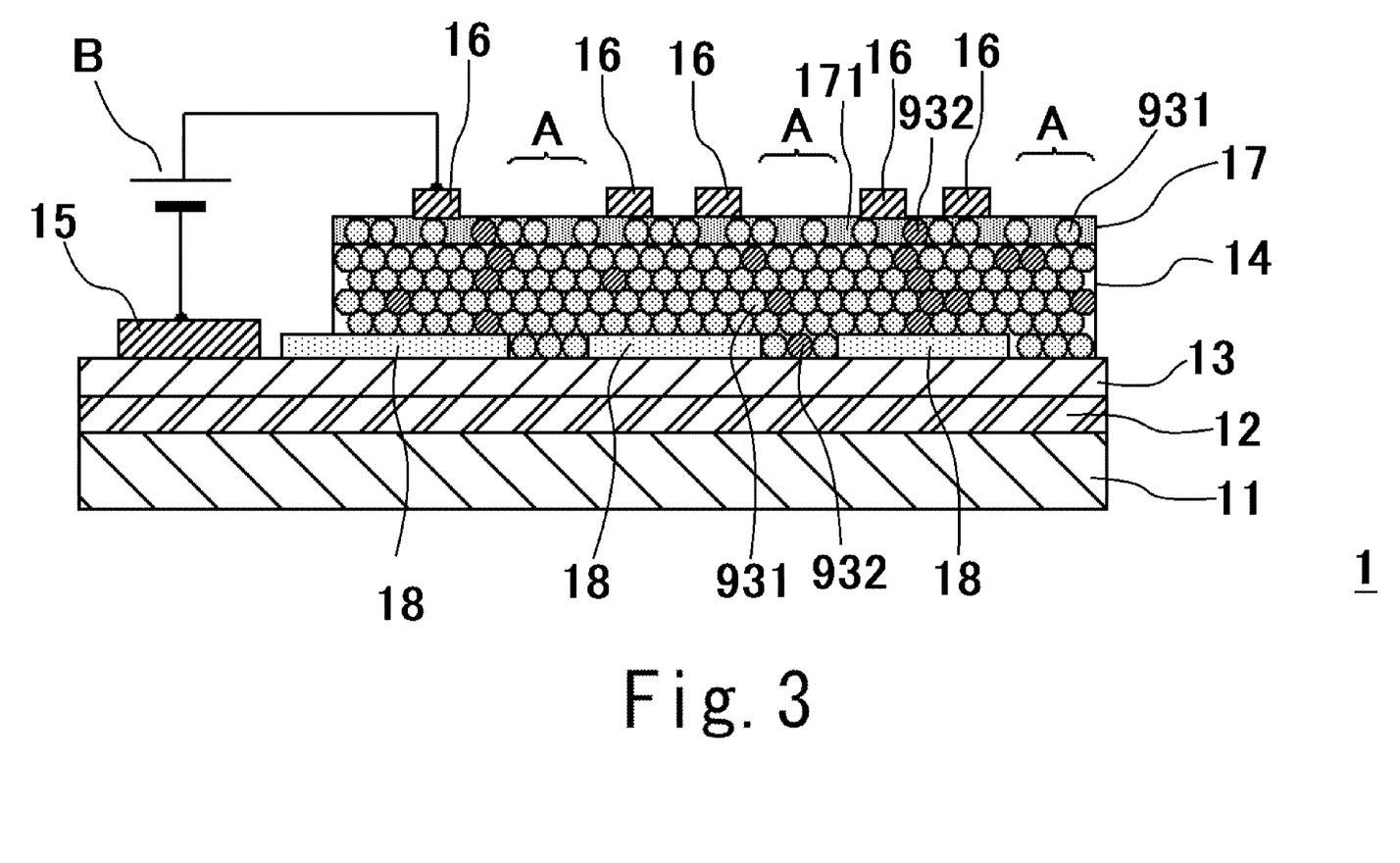
FIG. 3 is a cross-sectional diagram showing a light emitting device according to a second embodiment of the present invention.

In a photoelectric conversion device according to a second embodiment, the leakage current is reduced by setting the length of the leakage current path to be larger than the actual thickness of the p-type layer. FIG. 3 is a diagram showing a configuration of such a light emitting device 1, keeping correspondence to FIG. 1.

In the configuration, an n-type GZO (Ga-doped ZnO) layer (transparent electrode) 12 to function as a transparent electrode and an n-type ZnO layer (n-type layer: first semiconductor layer) 13 are sequentially formed on a substrate 11 made of metal (aluminum). The GZO layer 12 and the n-type layer 13 can be sequentially formed on the substrate 11 by a magnetron sputtering method or the like, as described in Patent Document 3. The configuration is different from that of FIG. 1 in that the opaque substrate 11 is used, and accordingly, emitted light is extracted not from the bottom side but from the top side. There, by mirror finishing the surface of the substrate 11, light emitted toward the bottom side can be reflected by the substrate 11 and thereby extracted from the top side.

On the n-type ZnO layer 13, a p-type ZnO layer (p-type layer: second semiconductor layer) 14 primarily consisting of p-type ZnO fine particles 931 is further formed. A method for forming the p-type layer 14 is also similar to that of the p-type layer described in Patent Documents 3 and 4, that is, the p-type layer 14 can be obtained by applying a dispersion liquid of p-type ZnO fine particles and performing subsequent firing. In that case, when a coating or printing method is used, patterning of the p-type layer 14 also can be easily performed, and it accordingly is possible to make the n-type layer 13 exposed only in a region on the left side in the drawing.

At the region where the n-type layer 13 is exposed, on the left side in the drawing, an n-side electrode 15 is formed. Further in FIG. 3, p-side electrodes 16 are formed on the p-type layer 14, in a plurality of regions. While only the most left one of the p-type electrodes 16 is connected to the power source B in FIG. 3, practically every one of the p-side electrodes 16 extends in the direction perpendicular to the plane of the page and is connected with all the other ones at its end, and accordingly, all the p-side electrodes 16 are integrated together. For example, the n-side electrode 15 and the p-type electrode 16 are each made of gold (Au). In the light emitting device 1, what primarily function as light emission layers to emit light when a forward bias is applied to the p-n junction are the n-type layer 13 and the p-type layer 14.

Further, between the p-type layer 14 and the p-side electrodes 16, a hole transport layer (carrier transport layer) 17 as that described in Yasuhisa Fujita, Islam Mohammad Shafiquil, Lin Jie and Toshiyuki Yoshida, "The effect of hole transporting layer for ZnO nanoparticle based LEDs", The 78th JSAP Autumn Meeting 8a-PA4-3, 2017, is formed. While the hole transport layer 17 does not directly contribute to light emission, it causes the p-type layer 14 serving as a light emitting layer and the p-side electrode 16 to be apart from each other, and thereby reduces the influence of extinction due to the presence of the p-side electrode 16. The hole transport layer 17 is of p-type conduction similarly to the p-type layer 14, but has a higher resistivity than the p-type layer 14. Accordingly, similarly to the p-type layer 14, the hole transport layer 17 can be formed using the p-type ZnO fine particles 931, where the formation can be performed by coating or printing. However, unlike the p-type layer 14, the density of the p-type ZnO fine particles 931 is set lower, where an insulating binder 171 for binding neighboring p-type ZnO fine particles 931 with each other is used. A constituent of the binder 171 is, for example, silsesquioxane, silicone, alumina, epoxy resin or the like, and is preferred to be transparent particularly to light emitted by ZnO particles, and to be insulating. Accordingly, the hole transport layer 17 is formed to have a higher resistivity than the p-type layer 14. However, the hole transport layer 17 is formed to be thinner than the p-type layer 14 and accordingly provides sufficient electric conduction in the thickness direction. Here, the thickness of the p-type layer 14 and that of the hole transport layer 17 are set in a range from 1 to 4 μm. Accordingly, in FIG. 3, for convenience, the p-type layer is depicted to have ZnO fine particles (p-type ZnO fine particles 931 or n-type ZnO fine particles 932) stacked in a maximum of five tiers in the thickness direction, and the hole transport layer is depicted to have only one tier in the thickness direction, but practically each of the layers often is formed to have a larger number of ZnO fine particles stacked in the thickness direction because the average particle size of the ZnO fine particles is in the range of 100 to 500 nm as described earlier.

In the present configuration, a thin insulating layer 18 is formed between the n-type layer 13 and the p-type layer 14. As shown in FIG. 3, in the insulating layer 18, openings are formed at regions A that are each apart from the p-side electrodes 16 without overlapping them in a plan view. As a result, regions at which the n-type layer 13 and the p-type layer 14 are directly in contact with each other are limited to only the regions A, and accordingly p-n junctions are formed only at the regions A in a plan view. The insulating layer 18 is made of a material allowing formation of the p-type layer 14 thereon, where $SiO_2$ or the like can be used, for example. After forming the insulating layer 18, the openings at regions A can be formed by local wet etching or the like, and after that, by forming the p-type layer 14 on the surface as described above, the light emitting device 1 can be obtained.

In the present case, when a forward bias is applied, current flows through the p-type layer 14 and the n-type layer 13 at regions A and their vicinity in a plan view where p-n junctions are formed, and light is emitted there. As regions where current flows through the p-n junctions are limited to the regions A, a current density in the regions can be particularly increased, and the light emission intensity accordingly can be increased there. When the regions A and the p-side electrodes 16 are arranged not to overlap in a plan view, blocking of the emitted light by the p-side electrodes is prevented. Providing a large number of openings (regions A) in the insulating layer 18 in a plan view, it becomes possible to cause the p-type layer 14 and the n-type layer 13 to emit light over a wide area in the plane.

Meanwhile, in the p-type layer 14, current flows through a region ranging from each of the regions A to corresponding ones of the p-side electrodes 16 that are adjacent to the region A in a plan view. In the present configuration, by arranging the p-side electrodes 16 to be apart from the regions A, the current paths in the p-type layer 14 can be made substantially longer than the layer thickness. As a result, even when the n-type ZnO fine particles 932 are incorporated in the p-type layer 14, a path of leakage current caused by the n-type ZnO fine particles 932 can be cut off by interposing the p-type ZnO fine particles 931 along the current path, and accordingly the leakage current can be reduced.

Here, incorporation of the n-type ZnO fine particles 932 similarly occurs in the hole transport layer 17 because it also is formed using the p-type ZnO fine particles 931, but the influence of the incorporation of the n-type ZnO fine particles 932 can be neglected compared with that in the p-type layer 14 because the binder 171 is used in the hole transport layer 17.

Figure 4:
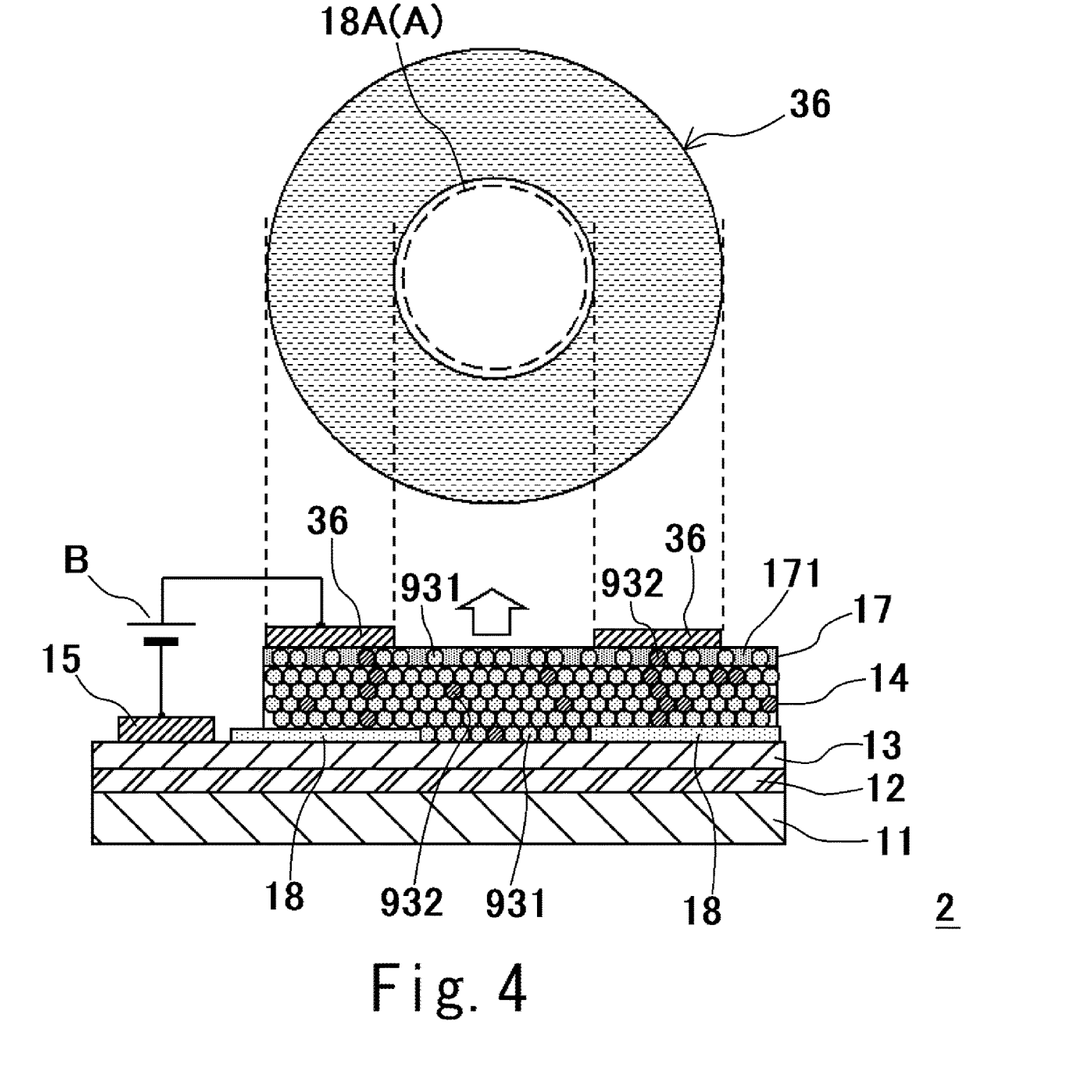
FIG. 4 is a cross-sectional diagram showing a modification of the light emitting device according to the second embodiment of the present invention.

In the configuration of FIG. 3, the p-side electrodes 16 are restricted in area in a plan view, and accordingly their contact area with the p-type layer 14 are to be smaller. As a result, it is difficult to reduce the contact resistance between the p-type layer 14 and the p-side electrodes 16, and there accordingly may be a case the current for light emission is limited. Therefore, it is particularly preferable to increase the contact area between the p-type layer 14 and the p-side electrodes 16 while increasing the current path length in the p-type layer 14 as described above. FIG. 4 is a diagram showing a configuration of a light emitting device 2 that has such a configuration as just described above and corresponds to a modification of the present embodiment.

In FIG. 4, the lower drawing shows a cross-sectional view corresponding to FIG. 3, and the upper one shows a plan view of a circular opening 18A formed in a p-side electrode 36 and the insulating layer 18. The p-side electrode 36 used in the present case is formed in a ring shape surrounding the opening 18A formed in the insulating layer 18, in the plan view. With this configuration, it becomes possible to make the p-side electrode 36 and the opening 18A not overlap each other in the plan view, and thereby increase the current path in the p-type layer 14. It also becomes possible, by thus forming the p-side electrode 36 into a ring shape surrounding the periphery of the opening 18A, to increase the contact area between the p-side electrode 36 and the p-type layer 14 (hole transport layer 17), and thereby increase the current for light emission. In the present case, emitted light can be extracted upward from the central opening of the p-side electrode 36.

Figure 5:
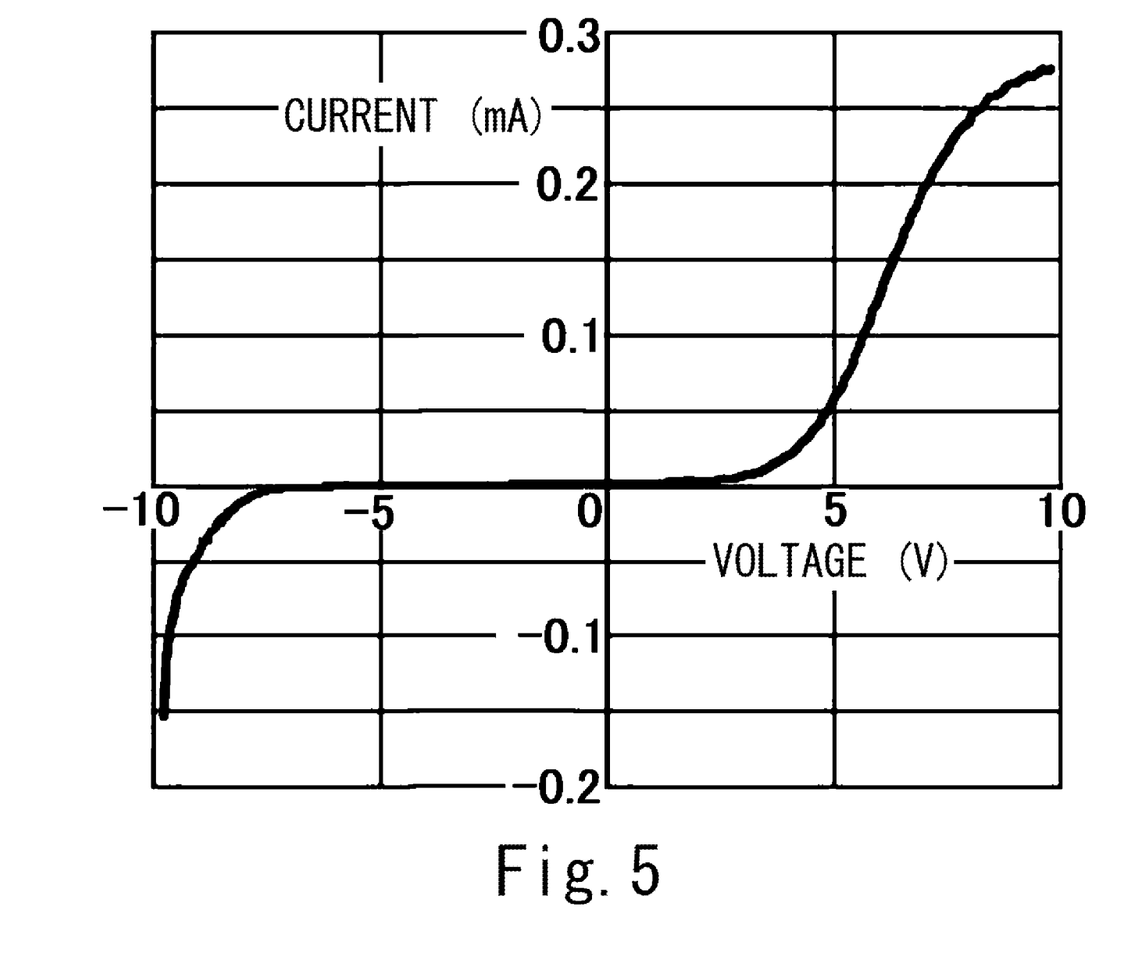
FIG. 5 shows a current-voltage characteristic of a light emitting device according to the first embodiment of the present invention.
Figure 6:
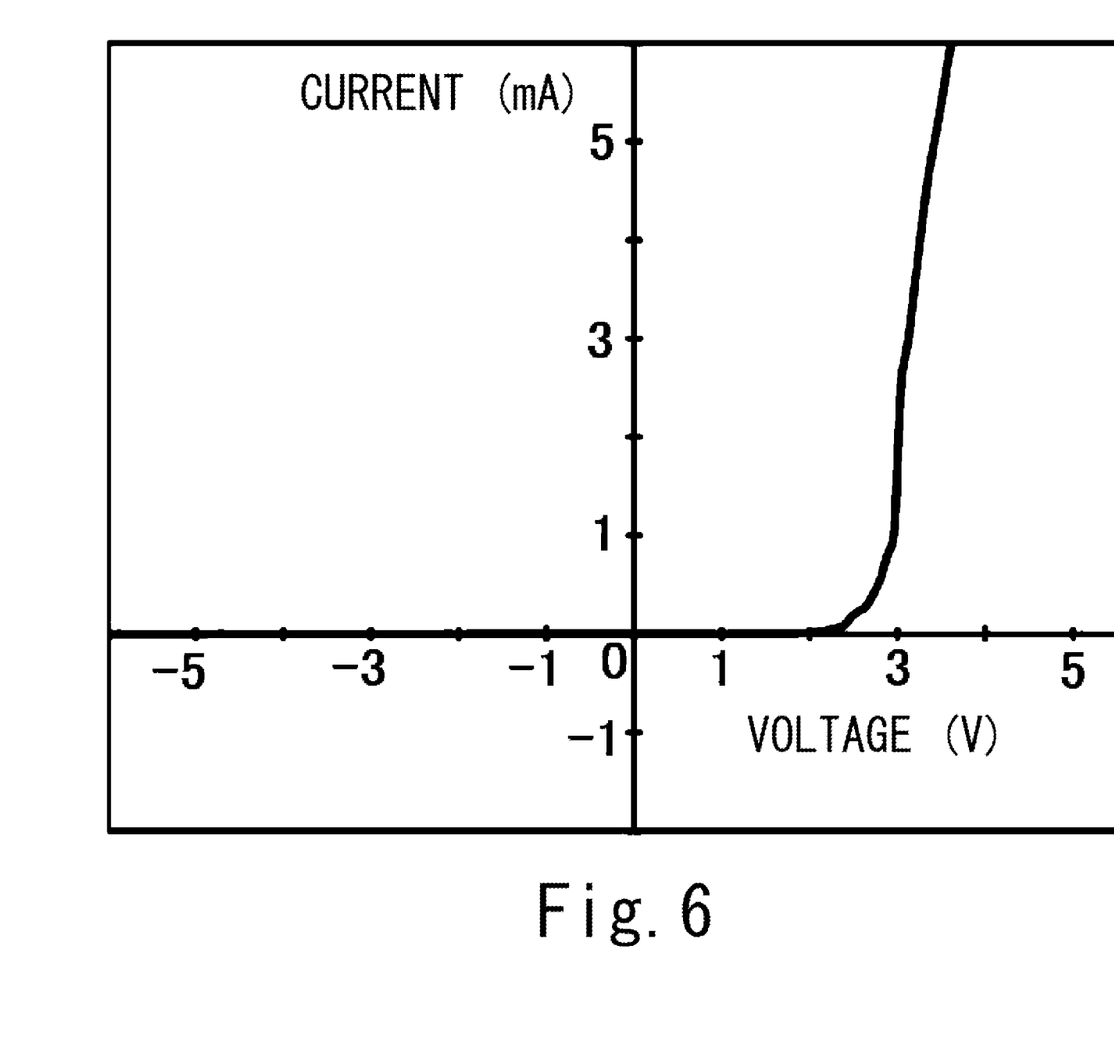
FIG. 6 shows a current-voltage characteristic of a light emitting device according to the second embodiment of the present invention.

As an example of the first embodiment, the light emitting device 9 having the configuration of FIG. 1 was actually fabricated, setting the thickness of the p-type layer 93 at 5 μm, and a result of measuring its current-voltage characteristic is shown in FIG. 5. While the absolute value of the vertical axis (current) in FIG. 5 is in a different range from that in FIG. 2 because the electrode area is different between the two cases, it is confirmed in FIG. 5 that the reverse current (leakage current) was reduced to a negligible level compared with the forward current. Further, as an example of the second embodiment, a light emitting device having the configuration of FIG. 3 was fabricated, and a result of measuring the same characteristic on it is shown in FIG. 6. Also in this case, it is confirmed that the reverse current (leakage current) was reduced to a negligible level compared with the forward current.

The thickness of the hole transport layer 17 is appropriately set depending on the thickness of the p-type layer 14. However, in the configurations of FIGS. 3 and 4, it is different from in "The effect of hole transporting layer for ZnO nanoparticle based LEDs" (2017) mentioned earlier that the hole transport layer 17 substantially functions to transport holes only in its portion just underneath the p-type electrode 16 or 36 but substantially does not have the function to transport holes in its portion above the opening.

In the case the p-type layer 14 is formed in the form of a sintered body of fine particles as described above, particularly when the particle size of the fine particles is large, the surface of the p-type layer 14 formed using no binder often does not become smooth but has ruggedness. In such a case, in forming the p-side electrode 16 or 36, when metal constituting the electrode intrudes a recessed portion of the surface of the p-type layer 14, it also causes leakage current or the like. As the binder 171 enables smoothing the ruggedness, it is preferable to form a thin hole transport layer on the p-type layer even when its effect of hole transport is small as described above.

In the above-described embodiments, it has been assumed that the p-type layer is made primarily of the p-type ZnO fine particles 931 with a minute amount of n-type ZnO fine particles 932 incorporated therein. However, also in a case the n-type layer is made primarily of n-type ZnO fine particles with a minute amount of p-type ZnO fine particles incorporated therein, leakage current can be similarly reduced by employing a similar configuration to that described above on the n-type layer side. In such a case, an electron transport layer may also be provided corresponding to the hole transport layer (carrier transport layer).

In the embodiments, the p-type layer and the n-type layer made primarily of, respectively, p-type ZnO fine particles and n-type ZnO fine particles can be easily formed on the insulating layer having the openings formed therein as described above. That is, the above-described photoelectric conversion devices can be easily fabricated.

While, in the above examples, descriptions have been given of cases where the photoelectric conversion devices are light emitting devices, reduction of leakage current in a reverse bias state is important also in a light receiving device using a ZnO p-n junction for converting light to electrical signals. Therefore, the above-described configurations are effective in such a light receiving device.

REFERENCE SIGNS LIST 1, 2, 9 light emitting device (photoelectric conversion device)
11 substrate
12 GZO layer (transparent electrode)
13, 92 n-type layer (first semiconductor layer)
14, 93 p-type layer (second semiconductor layer)
15, 94 n-side electrode
16, 36, 95 p-side electrode
17 hole transport layer (carrier transport layer)
18 insulating layer
18A opening
91 glass substrate
171 binder
931 p-type ZnO fine particle
932 n-type ZnO fine particle
B power supply

What is claimed is:

1. A photoelectric conversion device having a configuration in which a first semiconductor layer of a first conduction type and a second semiconductor layer of a second conduction type opposite to the first conduction type, the semiconductor layers each including zinc oxide (ZnO), are in contact with each other in a vertical direction to form a p-n junction on a substrate, one of the first and second semiconductor layers being formed by combining fine particles primarily consisting of ZnO fine particles of a conduction type corresponding to the one of the first and second semiconductor layers, an insulating layer being provided between the first and second semiconductor layers, the insulating layer having an opening formed in a region corresponding to a region where the p-n junction is to be formed, and an electrode connected to the one of the first and second semiconductor layers being formed in a manner of not overlapping the opening in a plan view.

2. The photoelectric conversion device according to claim 1, wherein the electrode has a ring shape surrounding the periphery of the opening in a plan view.

3. The photoelectric conversion device according to claim 1, wherein the one of the first and second semiconductor layers is formed such that n-type ZnO fine particles are incorporated in and combined with powders primarily consisting of p-type ZnO fine particles.

4. The photoelectric conversion device according to claim 3, wherein the second conduction type is the p-type, and
wherein the photoelectric conversion device comprises the first semiconductor layer of the n-type, the second semiconductor layer and the electrode sequentially on the substrate.

5. The photoelectric conversion device according to claim 1, comprising, between the one of the first and second semiconductor layers and the electrode, a carrier transport layer having the same conduction type as the one of the first and second semiconductor layers and formed by mixing ZnO fine particles of the same conduction type with insulating binder.

6. The photoelectric conversion device according to claim 1, wherein at least either of the first and second semiconductor layers emits light when voltage is applied to the first and second semiconductor layers to bias the p-n junction in the forward direction.

7. The photoelectric conversion device according to claim 6, wherein the substrate is made of metal, and
wherein light is extracted from the side opposite to the side where the substrate is present.

* * * * *